United States Patent [19]

Kobayashi et al.

[11] Patent Number: 4,907,701

[45] Date of Patent: Mar. 13, 1990

[54] APPARATUS FOR INSPECTING THE APPEARANCE OF SEMICONDUCTOR DEVICES

[75] Inventors: Kunio Kobayashi; Sekio Itoh, both of Itami, Japan

[73] Assignee: Mitsubishi Denki Kabushiki Kaisha, Japan

[21] Appl. No.: 233,742

[22] Filed: Aug. 19, 1988

[30] Foreign Application Priority Data

Jan. 13, 1988 [JP] Japan .................................. 63-6124

[51] Int. Cl.$^4$ ............................................... B07C 5/00
[52] U.S. Cl. .................................. 209/576; 198/774; 209/905; 209/939; 414/225; 414/416
[58] Field of Search ............... 209/576, 587, 577, 939, 209/573, 598, 914, 919, 905; 198/470.1, 803.5, 974, 740, 468.6, 468.1; 382/1, 8; 414/225, 416

[56] References Cited

U.S. PATENT DOCUMENTS

| | | | |
|---|---|---|---|
| 3,384,236 | 5/1968 | Best et al. | 209/905 X |
| 3,716,134 | 2/1973 | Campbell | 209/587 X |
| 3,750,878 | 8/1973 | Atchley | 209/573 X |
| 4,456,115 | 6/1984 | McKnight et al. | 198/433 X |
| 4,534,695 | 8/1985 | Stump et al. | 414/225 X |
| 4,598,813 | 7/1986 | Ray | 198/525 X |
| 4,696,047 | 9/1987 | Christian et al. | 382/8 |
| 4,740,136 | 4/1986 | Asai et al. | 414/416 X |
| 4,787,845 | 4/1988 | Susuki et al. | 382/8 X |

Primary Examiner—Donald T. Hajec
Attorney, Agent, or Firm—Leydig, Voit & Mayer

[57] ABSTRACT

An apparatus for inspecting the appearance of a semiconductor device has an imaging device which forms an image of the outside of a semiconductor device. An image analyzer analyzes the image and determines whether the semiconductor device is good or bad. A semiconductor device to be inspected is removed from a first conveyor on the periphery of a turntable by a vacuum chuck which is mounted on the turntable, and the semiconductor device is transported to in front of the imaging device by a turntable. If the semiconductor device is determined to be good, the turntable transports the semiconductor device to a second conveyor on the periphery of the turntable, and the vacuum chuck deposits the semiconductor device on the second conveyor. If the semiconductor device is determined to be bad, the turntable transports the semiconductor device to a discard receiving mechanism on the periphery of the turntable, and the vacuum chuck deposits the semiconductor device on the discard receiving mechanism.

3 Claims, 4 Drawing Sheets

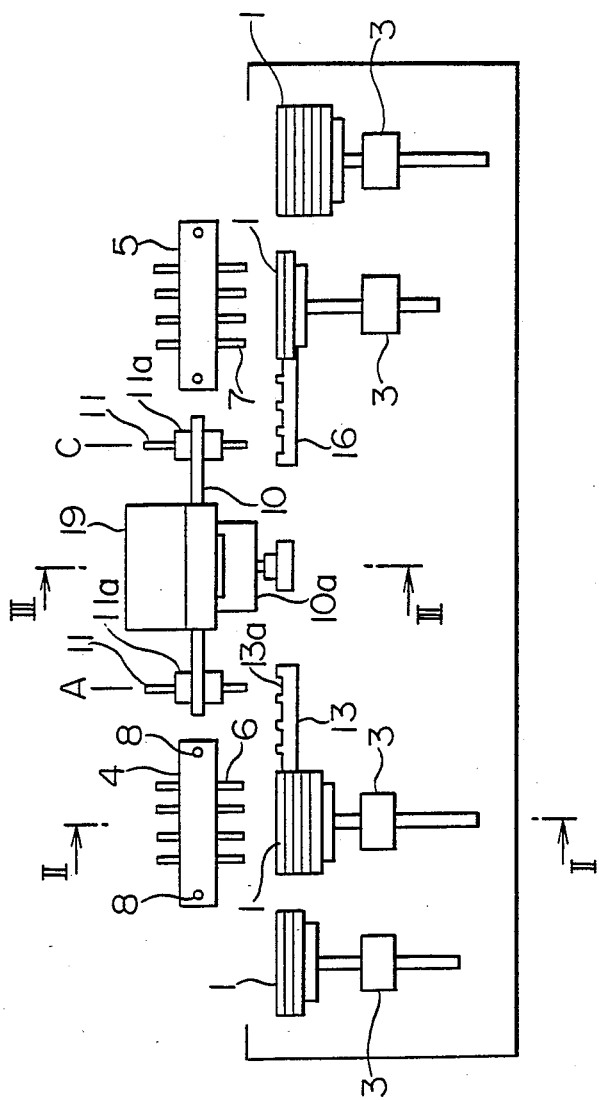

APPARATUS FOR INSPECTING THE APPEARANCE OF SEMICONDUCTOR DEVICES

BACKGROUND OF THE INVENTION

This invention relates to an apparatus for automatically inspecting the appearance of semiconductor devices for physical damage such as bent leads.

At the present time, semiconductor devices normally undergo visual inspection by workers for physical damage to the outside of the device, such as bent leads. As this visual inspection is performed by humans, it is inefficient and the results of inspection are highly variable. This visual inspection reduces productivity and the reliability of the semiconductor devices. There is thus a great need for an apparatus which can automatically perform the inspection of the appearance of semiconductor devices.

SUMMARY OF THE INVENTION

Accordingly, it is an object of the present invention to provide an apparatus for automatically inspecting the appearance of semiconductor devices which is efficient and accurate.

In the present invention, a semiconductor device is inspected using an imaging device which forms an image of the outside of a semiconductor device and an image analyzer which analyzes the image and determines whether the semiconductor device is good or bad. As image analysis is performed automatically without any need for decisions by humans, the consistency of results is very good.

An apparatus for inspecting the appearance of a semiconductor device in accordance with the present invention comprises first conveyor means for conveying a semiconductor device to a first position on a circle;

imaging means for forming an image of a semiconductor device at a second position on the circle;

second conveyor means for conveying a semiconductor device from a third position on the circle;

discard means for receiving a semiconductor device at a fourth position on the circle;

handling means for removing a semiconductor device from the first conveyor means at the first position, transporting it to the second position, and then placing it on the second conveyor means at the third position or on the discard means at the fourth position;

image analyzing means for analyzing the image of a semiconductor device which is formed by the imaging means and determining whether the semiconductor device of which the image was formed is good or bad; and control means responsive to the image analyzing means for controlling the handling means based on the determination by the image analyzing means so that a good semiconductor device is placed by the handling means on the second conveyor means at the third position and a bad semiconductor device is placed by the handling means on the discard means at the fourth position.

Any type of imaging means can be used to form an image of a semiconductor which is being inspected. In a preferred embodiment, the imaging means is a vidicon camera.

There is no restriction on the exact form of the handling means which transports a semiconductor device to the four positions on the circle. In a preferred embodiment, the handling device is a turntable on which a vacuum chuck is mounted. The vacuum chuck an hold a semiconductor device by suction and be raised and lowered to remove a semiconductor device from the first conveyor means and deposit the semiconductor device onto the second conveyor means or the discard means.

There is no restriction on the number of vacuum chucks which are employed, but in a preferred embodiment, the turntable is equipped with four vacuum chucks which are equally distant from the center of the turntable and disposed at intervals of 90° with respect to the center of the turntable.

The present invention may be further equipped with loading and unloading mechanisms for transferring semiconductor devices from storage trays to the first conveyor means, and from the second conveyor means to storage trays.

BRIEF DESCRIPTION OF THE DRAWINGS

FIG. 1b is a schematic front view of the embodiment of FIG. 1a.

FIG. 4 is an enlarged perspective view of a portion of the first conveyor of FIG. 1a.

FIG. 5 is an enlarged perspective view of a portion of the discard tray of FIG. 1a.

FIG. 6 is an enlarged perspective view of one of the storage trays of FIG. 1a.

In the drawings, the same reference numerals indicate the same or corresponding parts.

DESCRIPTION OF THE PREFERRED EMBODIMENT

Figure 1A:
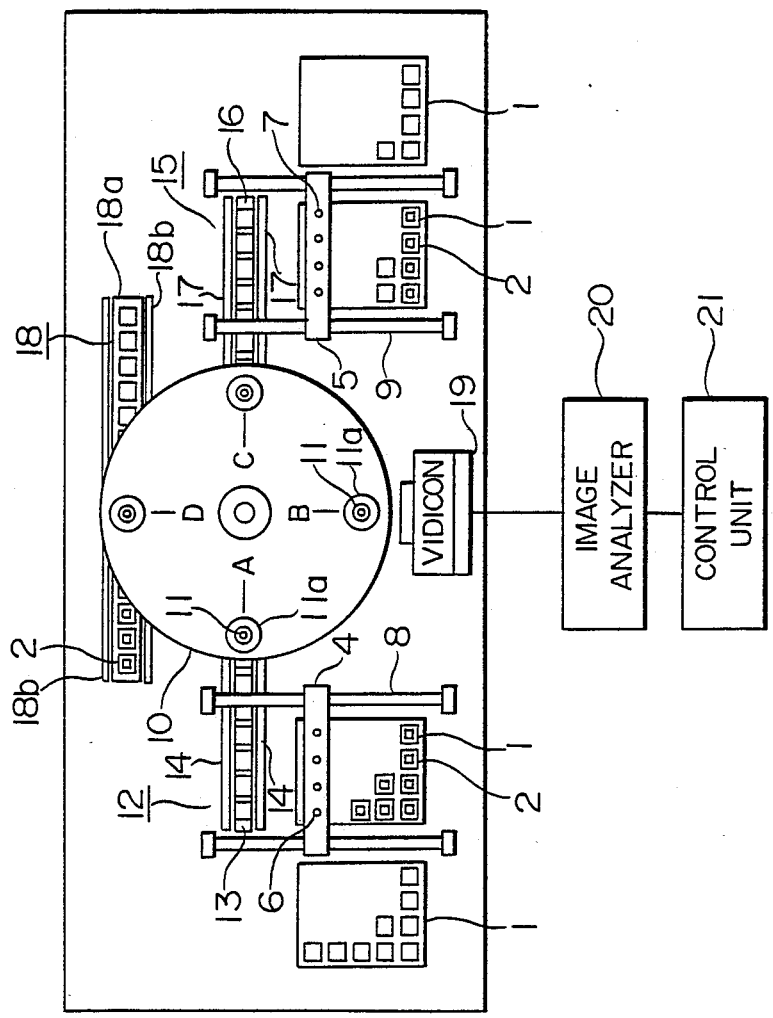
FIG. 1a is a schematic plan view of an embodiment of an inspection apparatus in accordance with the present invention.
Figure 6:
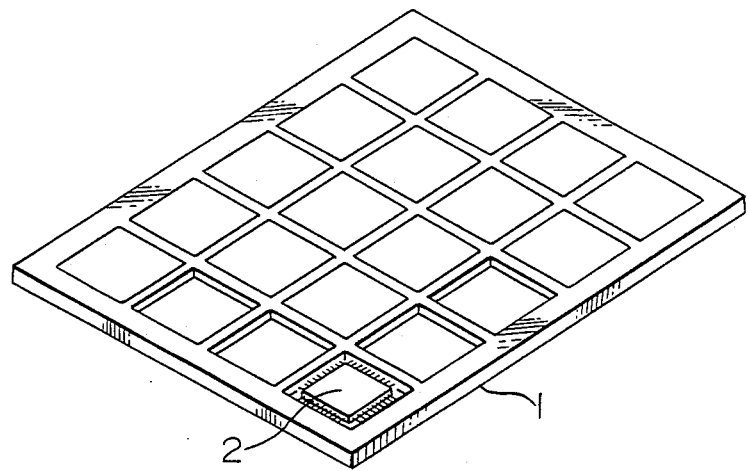

Hereinbelow, a preferred embodiment of an inspection apparatus in accordance with the present invention will be described while referring to the accompanying drawings, FIGS. 1a and 1b of which are respectively a schematic plan view and a schematic front view of this embodiment. As shown in these figures, semiconductor devices 2 which have a plurality of leads extending therefrom are stored in storage trays 1. Each storage tray 1 is a rectangular member like the tray 1 illustrated in FIG. 6 on whose upper surface is formed a rectangular grid of storage compartments, each of which can hold a singular semiconductor device 2. The storage trays 1 on the left side of the apparatus hold semiconductor devices 2 prior to inspection, and the storage trays 1 on the right side of the apparatus hold semiconductor devices 2 which have passed inspection. As shown in FIG. 1b, the storage trays 1 are stacked atop elevators 3 which can raise and lower the storage trays 1 to a suitable height. A loading mechanism 4 for transferring the semiconductor devices 2 from the trays 1 to a first conveyor 12 is disposed on the left side of the apparatus above one of the stacks of storage trays 1. The loading mechanism 4 can move horizontally along a pair of horizontal guides 8 to a desired position above the storage trays 1. The loading mechanism 4 is equipped with a plurality of vacuum chucks 6 equal in number to the number of semiconductor devices 2 in a single row of one of the trays 1. Each vacuum chuck 6 can hold a single semiconductor device 2 by suction. The vacuum chucks can be raised and lowered by the loading mechanism 4. Similarly, an unloading mechanism 5 for transferring semiconductor devices 2 from a second conveyor 15 to storage trays 1 is disposed on the right side of the apparatus above another stack of storage trays 1. It is identical in construction to the loading mechanism 4, having a plurality of vacuum chucks 7 which it can raise and lower. Like the loading mechanism 4, the unloading mechanism 5 can move horizontally atop a pair of horizontal guides 9 to a desired position above the storage trays 1.

A motor-operated turntable 10 is disposed roughly midway between the loading mechanism 4 and the unloading mechanism 5. The turntable 10 is equipped with four vacuum chucks 11 which are disposed at intervals of 90° about the center of the turntable 10 at the same distance therefrom. Each of the vacuum chucks 11 is held by a chuck handling device 11a which is able to raise and lower the chuck 11 as well as rotate the chuck 11 about it axis. The motor 10a of the turntable 10 is controlled by a control unit 21 to rotate the turntable 10 by 90° at a time. Each one of the vacuum chucks 11 is always situated at one of four different positions A-D, respectively, which are located at intervals of 90° along a circle which is concentric with the turntable 10.

Figure 4:
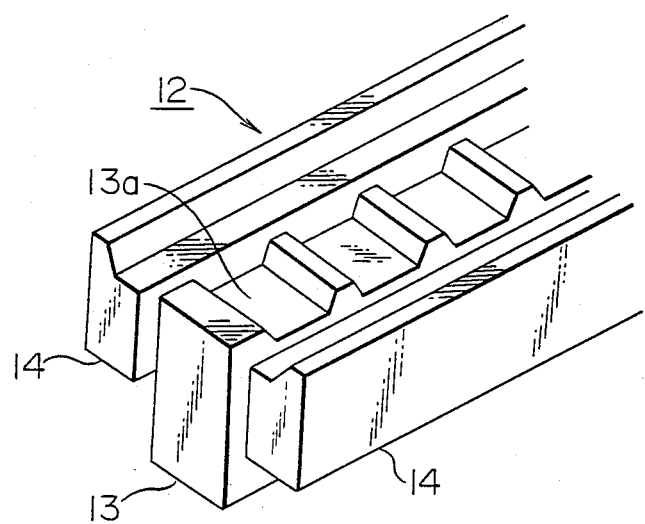

A first conveyor 12 is disposed perpendicular to the guides 8 of the loading mechanism 4 and extends from beneath the guides 8 to beneath the turntable 10 at position A. The first conveyor 12 has a moving tray 13 and two stationary rails 14 which extend along the sides of the moving tray 13 and support it. The moving tray 13 has a single row of compartments 13a formed in its top surface. Each compartment 13a is large enough to hold one semiconductor device 2. The moving tray 13, supported by pins 14a fixed to rails 14, can be moved along the rails 14 towards and away from the turntable 10 by a motor 22. The motor moves the moving tray 13 incrementally in steps equal to the distance between the centers of adjacent compartments 13a in the moving tray 13. FIG. 4 illustrates the structure of a portion of the first conveyor 12.

Similarly, a second conveyor 15 of identical construction is disclosed on the opposite side of the turntable 10, perpendicular to the guides 9 of the unloading mechanism 5 and extending from beneath the guides 9 to beneath the turntable 10 at position C. It comprises a moving tray 16 and two parallel, stationary rails 17 which support the moving tray 16. The moving tray 16 of the second conveyor 15 is moved incrementally along the rails 17 by an unillustrated motor in the same direction as the other moving tray 13 and by the same distance each step.

Figure 5:
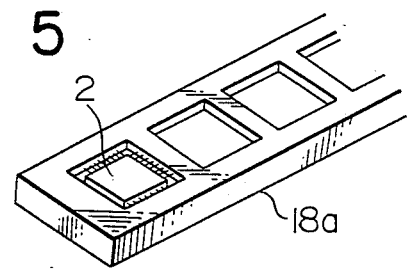

A discard receiving mechanism 18 for receiving semiconductor devices 2 which are damaged or otherwise unsatisfactory is disposed beneath the turntable 10 and extends parallel to the conveyors 12 and 15 along a line which passes through the fourth position D. It comprises a discharge tray 18a and a pair of stationary rails 18b which support the discharge tray 18a. As shown in FIG. 5 (from which pins 14a are omitted for simplicity), the discharge tray 18a has a single row of compartments formed in its upper surface, each of which can hold a single semiconductor device 2. The discharge tray 18a is moved incrementally along the rails 18b by an unillustrated motor so that one of the compartments is always at position D. Each time the discharge tray 18a is moved, it is moved by an amount equal to the distance between the centers of adjacent compartments in its top surface.

Figure 3:
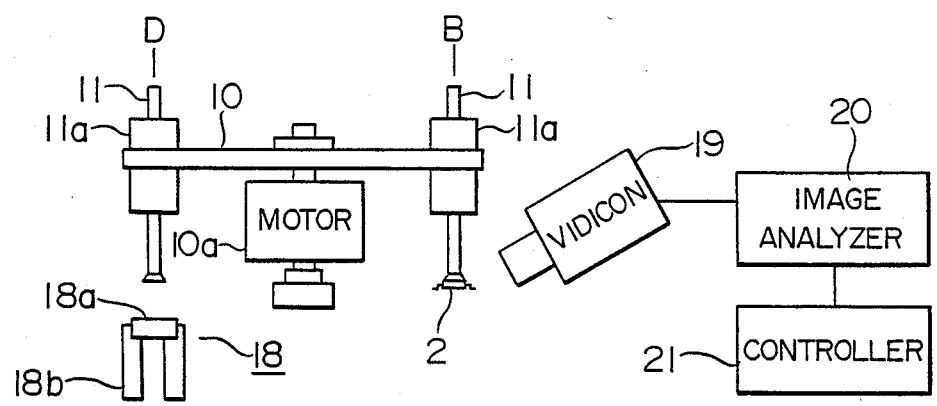
FIG. 3 is a schematic side view showing the portion of this embodiment at Line III—III of FIG. 1b.

An imaging device 19 in the form of a vidicon camera is disposed to the side of the turntable in the vicinity of position B. As shown in FIG. 3, which is a side view of the portion of this embodiment at Line III—III of FIG. 1b, the imaging device 19 is aimed at a semiconductor device 2 held by one of the vacuum chucks 11 at position B. It forms an image of a desired portion of the outside of the semiconductor device 2, such as the leads, and transmits this image to an image analyzer 20 to which it is connected. The image analyzer 20 analyzes the image and determines whether the semiconductor device 2 is damaged or not. The determination could be based, for example, on whether any of the leads to the semiconductor device 2 are bent. Based on the determination by the image analyzer 20, a control unit 21 controls the vacuum chucks 11 to place the semiconductor device 2 which was examined on the second conveyor 15 or on the discard tray 18a.

Figure 2:
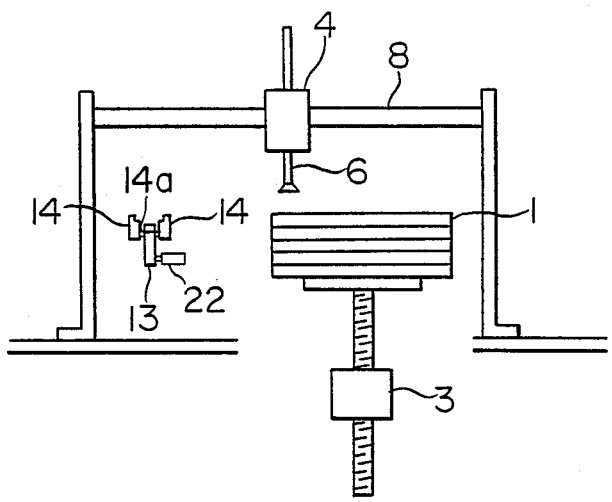
FIG. 2 is a schematic side view showing the portion of this embodiment at Line II—II of FIG. 1b.

The operation of the illustrated embodiment is as follows. The trays 1 which are stacked below the loading mechanism 4 are raised to a suitable height by the elevator 3, and the loading mechanism 4 moves along the guides 8 until the vacuum chucks 6 are disposed above one of the rows of the uppermost tray 1 as shown in FIG. 2. The vacuum chucks 6 are then lowered by the loading mechanism 4 until the vacuum chucks 6 contact the semiconductor devices 2. Each of the vacuum chucks 6 grasps one of the semiconductor devices 2 using suction, and the loading mechanism 4 then raises the vacuum chucks 6, thereby removing an entire row of semiconductor devices 2 from the tray 1 at one time. The loading mechanism 4 then moves horizontally along the guides 8, and when the vacuum chucks 6 are disposed above the moving tray 13 of the first conveyor 12, the vacuum chucks 6 are lowered and a row of semiconductor devices 2 is deposited onto the moving tray 13.

The unillustrated motor of the first conveyor 12 then moves the moving tray 13 one step at a time towards position A. When one of the semiconductor devices 2 on the moving tray 13 is located beneath the turntable 10 at position A, the vacuum chuck 11 which is at position A at that moment is lowered by the corresponding chuck handling device 11a until it contacts the semiconductor device 2. The vacuum chuck 11 grasps the semiconductor device 2 by suction, and then it is raised to remove the semiconductor device 2 from the moving tray 13.

Next, the turntable 10 is rotated counterclockwise 90° in FIG. 1b so that the vacuum chuck 11 which is holding the semiconductor device 2 is moved from position A to position B, where it is stopped. At position B, as shown in FIG. 2, the semiconductor device 2 is viewed by the imaging device 19. The vacuum chuck 11 at position B is rotated about its axis by the chuck handling device 11a so that all four sides of the semiconductor device 2 can be viewed by the imaging device 19. The image analyzer 20, which receives the image from the imaging device 19, determines whether the semiconductor device 2 is good or bad based on whether it has certain types of external physical damage, such a bent leads.

After the semiconductor device 2 is viewed by the imaging device 19, the turntable 10 is again rotated 90° counterclockwise in FIG. 1a and the vacuum chuck 11 is moved from position B to position C. In position C, the semiconductor device 2 which was just inspected is positioned above one of the empty compartments of the moving tray 16 of the second conveyor 15. If the image analyzer 20 determined that the semiconductor device 2 was good, the chuck handling device 11a is controlled by the control unit 21 to lower the vacuum chuck 11 and deposit the semiconductor device 2 on the moving tray 16 of the second conveyor 15. The unillustrated motor of the second conveyor 15 then moves the moving tray 16 one step to the right in FIG. 1b towards the unloading mechanism 5. When a row of inspected semiconductor devices 2 comes in front of the unloading mechanism 5, the row is transferred from the moving tray 16 of the second conveyor 15 to the uppermost tray 1 beneath the unloading mechanism 5 by the reverse of the operation which was used by the loading mechanism 4 to transfer the semiconductor devices 2 from the trays 1 to the first conveyor 12.

On the other hand, if the image analyzer 20 determined that the semiconductor device 2 was bad, instead of being deposited onto the second conveyor 15 at position C, the semiconductor device 2 is transported to position D by a further 90° counterclockwise rotation of the turntable 10. At position D, the semiconductor device 2 is disposed above one of the empty compartments of the discard tray 18a. The chuck handling device 11a of the vacuum chuck 11 which holds the bad semiconductor device 2 is then controlled by the control unit 21 to lower the semiconductor device 2 and deposit it in the discard tray 18a. The unillustrated motor of the discard receiving mechanism 18 then moves the discard tray 18a one step horizontally until an empty compartment of the discard tray 18a is located at position D. The turntable 10 is again rotated 90° counterclockwise until the vacuum chuck 11 reaches position A again, and the above-described process is repeated.

In the above manner, the inspection of a semiconductor device can be performed entirely automatically. In accordance with the present invention, the determination of whether a semiconductor device is good or bad is made by an image analyzer, so that consistency of results is good. Furthermore, as the semiconductor devices are handled by machine, inspection can be performed efficiently. Therefore, productivity and the reliability of the semiconductor devices are both increased.

In the above description, the operation of only a single vacuum chuck 11 was described, but as the turntable 10 is equipped with four vacuum chucks 11, the operations of removing a semiconductor device 2 from the first conveyor 12, inspecting a semiconductor device 2 with the imaging device 19, loading a good semiconductor device 2 onto the second conveyor 15, and placing a bad semiconductor device 2 onto the discard tray 18a are carried out simultaneously at the four positions A-D.

In the above-described embodiment, storage trays 1 are used to hold the semiconductor devices 2 before and after inspection. However, other types of storage devices can be used, such as storage tubes or rails which support the semiconductor devices to suitable locations.

In addition, instead of placing the good semiconductor devices 2 onto the second conveyor 15 at position C and placing the bad semiconductor devices 2 onto a discard tray 18a at position D, the bad semiconductor devices 2 could be placed onto the second conveyor 15 at position C, and the good semiconductor devices 2 could be wrapped for shipment in embossed tape at position D.

Furthermore, although the imaging device 19 in the preceding embodiment was used to inspect for physical damage such as bent leads, the present invention can be used to inspect any characteristics of the appearance of a semiconductor device which the image analyzer 20 is capable of analyzing. For example, the present invention could be used to inspect the printing on the outside of a semiconductor device.

What is claimed is:

1. An apparatus for inspecting packaged semiconductor devices comprising:

a turntable including at least four vacuum chucks for holding and releasing semiconductor devices, said turntable rotating about a central axis;

means for incrementally rotating said turntable about said axis to position said vacuum chucks in first, second, third, and fourth rotational positions;

loading means for transferring uninspected semiconductor devices from storage trays to a first conveyor means for conveying the uninspected semiconductor devices to said vacuum chucks in the first rotational position; said first conveyor means including a first elongated tray having a plurality of compartments, each compartment for containing a semiconductor device and means for incrementally moving said first elongated tray towards said vacuum chucks in the first rotational position;

means for translating said vacuum chucks in the first, third, and fourth rotational positions between (i) a lowered position for engaging and releasing a semiconductor device before and after inspection, respectively, and (ii) a raised inspecting position for inspection of a semiconductor device when said vacuum chucks are in the second rotational position;

inspection means for inspecting the exterior of a semiconductor device including imaging means for forming an image of a semiconductor device held by said vacuum chucks in the second rotational position and image analyzing means for analyzing the image formed by said imaging means and for determining whether an imaged semiconductor device is acceptable;

second conveyor means for conveying acceptable semiconductor devices away from said vacuum chucks when in the third rotational position, said second conveyor means including a second elongated tray having a plurality of compartments, each compartment for holding a semiconductor device, and means for incrementally moving said second elongated tray away from said turntable when said vacuum chucks are in the third rotational position;

unloading means for transferring acceptable inspected semiconductor devices from said second elongated tray to storage trays;

discard means for receiving unacceptable semiconductor devices when said vacuum chucks are in the fourth rotational position; and control means responsive to said inspection means for controlling said means for incrementally rotating said turntable and said means for translating to release an acceptable semiconductor device from a vacuum chuck in the third rotational position and to release an unacceptable semiconductor device from a vacuum chuck in the fourth rotational position to said discard means.

2. An apparatus as claimed in claim 1 wherein the first, second, third, and fourth rotational positions are located 90° apart, and said four vacuum chucks are disposed equally distant from the axis of said turntable and from each other.

3. An apparatus as claimed in claim 1, wherein said imaging means is a vidicon camera.

* * * * *